(12) United States Patent
Yamamoto et al.

(10) Patent No.: US 8,242,817 B2
(45) Date of Patent: Aug. 14, 2012

(54) POWER-ON RESET CIRCUIT WITH SUPPRESSED CURRENT

(75) Inventors: Kosuke Yamamoto, Tokyo (JP); Fumihiro Inoue, Tokyo (JP)

(73) Assignee: Mitsumi Electric Co., Ltd., Tokyo (JP)

( * ) Notice: Subject to any disclaimer, the term of this patent is extended or adjusted under 35 U.S.C. 154(b) by 0 days.

(21) Appl. No.: 13/093,338

(22) Filed: Apr. 25, 2011

(65) Prior Publication Data

US 2011/0267115 A1 Nov. 3, 2011

(30) Foreign Application Priority Data

Apr. 28, 2010 (JP) ................. 2010-104330

(51) Int. Cl.
*H03L 7/00* (2006.01)

(52) U.S. Cl. ............... 327/143; 327/74; 327/76; 327/77

(58) Field of Classification Search .................. 327/74, 327/76, 77, 80, 81, 143
See application file for complete search history.

(56) References Cited

U.S. PATENT DOCUMENTS 6,236,249 B1 * 5/2001 Choi et al. .................... 327/143
7,453,295 B2 * 11/2008 Hotaka ......................... 327/143

FOREIGN PATENT DOCUMENTS

JP 2009-123168 6/2009
WO WO 2009/066575 5/2009

* cited by examiner

*Primary Examiner* — Long Nguyen
(74) *Attorney, Agent, or Firm* — IPUSA, PLLC

(57) ABSTRACT

A power-on reset circuit includes a first monitor circuit that monitors a power supply voltage, an output circuit that outputs a reset release signal upon detection, by the first monitor circuit, of the power supply voltage exceeding a first predetermined value, and a control circuit having lower current consumption than the first monitor circuit, wherein the control circuit includes a second monitor circuit that monitors the power supply voltage, a suppression circuit that suppresses current flowing through the first monitor circuit upon detection, by the second monitor circuit, of the power supply voltage exceeding a second predetermined value higher than the first predetermined value, and an output fixing circuit that fixes the output of the output circuit to a predetermined potential upon detection, by the second monitor circuit, of the power supply voltage exceeding the second predetermined value.

3 Claims, 6 Drawing Sheets

POWER-ON RESET CIRCUIT WITH SUPPRESSED CURRENT

BACKGROUND OF THE INVENTION

1. Field of the Invention

The disclosures herein relate to a power-on reset circuit that outputs a reset release signal.

2. Description of the Related Art

A power-on reset circuit that negates a reset signal upon detecting the rise of a power supply voltage exceeding above a predetermined threshold is known in the art (see Patent Document 1, for example). FIG. 1 is a drawing illustrating a basic configuration of a related-art power-on reset circuit disclosed in Patent Document 1, for example. In the case of the circuit illustrated in FIG. 1, a comparator C1 outputs a low-level voltage signal POR immediately after the start of applying a power supply voltage VDD since a divided voltage Va obtained by dividing the power supply voltage VDD through resistors R1 and R2 is lower than a reference voltage Vref. When the power supply voltage VDD reaches a certain level, the divided voltage Va exceeds the reference voltage Vref, so that the comparator C1 outputs a high-level voltage signal POR. Namely, the circuit illustrated in FIG. 1 indicates a reset state when the low-level voltage signal POR is output, and indicates a reset release state when the high-level voltage signal POR is output.

FIG. 2 is a time chart illustrating the changes of the voltage signal POR and the power supply voltage VDD from the start to the end of applying the power supply voltage VDD in the circuit of FIG. 1. The power supply voltage VDD is controlled by a voltage control circuit such as a regulator such that the power supply voltage VDD becomes equal to a preset target voltage. In the initial stage of applying power supply voltage VDD, the voltage signal FOR generally changes from a low level to a high level in the range lower than the target voltage of the power supply voltage VDD. With such a change, the operating mode shifts from a reset mode to a reset release mode. In the end stage for the end of applying the power supply voltage VDD, the voltage signal POR changes from a high level to a low level in the range lower than the target voltage of the power supply voltage VDD. With such a change, the operating mode shifts from the reset release mode to the reset mode.

In the related-art power-on reset circuit, the voltage detected for the purpose of switching between the reset mode and the reset release mode needs to be constantly monitored from the start to the end of applying the power supply voltage VDD. Such constant voltage monitoring contributes to an increase in the current consumption by the power-on reset circuit.

Accordingly, it may be desired to provide a power-on reset circuit that can reduce current consumption.

[Related-Art Documents]
[Patent Document]
[Patent Document 1] Japanese Patent Application Publication No. 2009-123168

SUMMARY OF THE INVENTION

It is a general object of the present invention to provide a power-on reset circuit that substantially eliminates one or more problems caused by the limitations and disadvantages of the related art.

According to one embodiment, a power-on reset circuit includes a first monitor circuit that monitors a power supply voltage, an output circuit that outputs a reset release signal upon detection, by the first monitor circuit, of the power supply voltage exceeding a first predetermined value, and a control circuit having lower current consumption than the first monitor circuit, wherein the control circuit includes a second monitor circuit that monitors the power supply voltage, a suppression circuit that suppresses current flowing through the first monitor circuit upon detection, by the second monitor circuit, of the power supply voltage exceeding a second predetermined value higher than the first predetermined value, and an output fixing circuit that fixes the output of the output circuit to a predetermined potential upon detection, by the second monitor circuit, of the power supply voltage exceeding the second predetermined value.

According to at least one embodiment, current consumption in the circuit is reduced.

BRIEF DESCRIPTION OF THE DRAWINGS

Other objects and further features of the present invention will be apparent from the following detailed description when read in conjunction with the accompanying drawings, in which.

DESCRIPTION OF THE PREFERRED EMBODIMENTS

Figure 3:
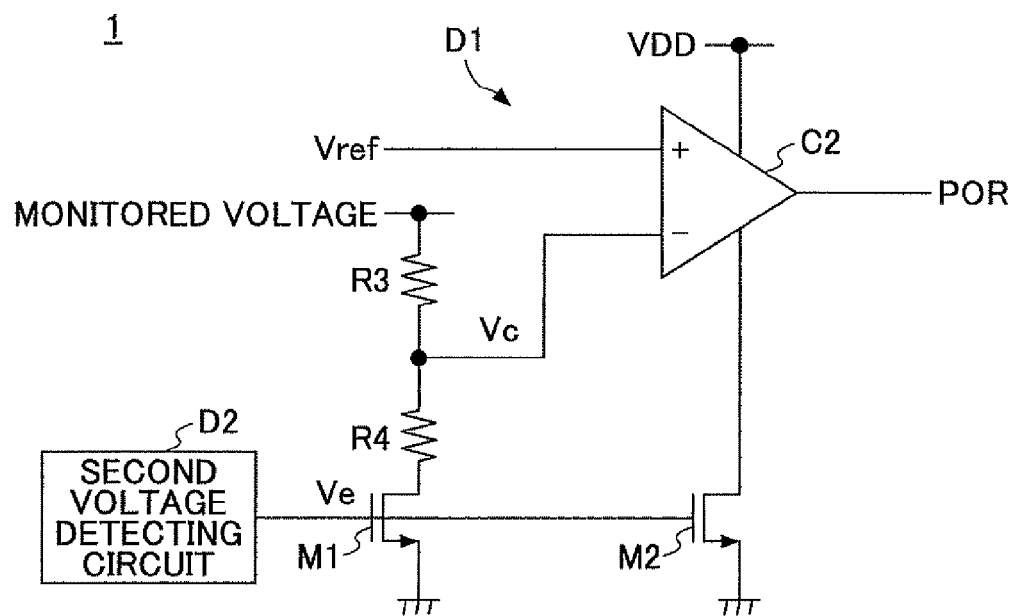
FIG. 3 is a circuit diagram illustrating a power-on reset circuit according to an embodiment.

In the following, embodiments will be described with reference to the accompanying drawings. FIG. 3 is a circuit diagram illustrating a power-on reset circuit according to an embodiment. A power-on reset circuit 1 provides a power-on reset (POR) function by which peripheral circuits are maintained in a reset state until the power supply voltage VDD reaches a voltage at which the peripheral circuits do not malfunction.

The power-on reset circuit 1 includes a first voltage detecting circuit D1, a second voltage detecting circuit D2, and standby switches M1 and M2. The first voltage detecting circuit D1 operates by using the power supply voltage VDD as a drive voltage. The first voltage detecting circuit D1 includes a resistor-based potential divider circuit R3 and R4 and a comparator C2.

The resistor-based potential divider circuit R3 and R4 serves as a monitor circuit that monitors the power supply voltage VDD. The resistor-based potential divider circuit R3 and R4 is a series circuit comprised of resistors R3 and R4, and is inserted between the ground line and the voltage line that supplies the monitored voltage. The monitored voltage is a voltage that follows a change in the power supply voltage VDD. The power supply voltage VDD may serve as the monitored voltage. The resistor-based potential divider circuit R3 and R4 divides the monitored voltage by use of the resistors R3 and R4, so that a detection voltage Vc obtained by dividing the monitored voltage appears at the connection point between the resistor R3 and the resistor R4. Namely, the detection voltage Vc is responsive to the power supply voltage VDD. A ratio of the resistance value of the resistor R3 to the resistance value of the resistor R4 may be 1:2, for example. The monitored voltage may be divided by use of three or more resistors.

The comparator C2 includes an input comparison circuit for receiving the detection voltage Vc and a predetermined reference voltage Vref and an output circuit for outputting a voltage signal POR serving as a reset signal and a reset release signal. The details of the input comparison circuit and the output circuit will be described later. The output circuit outputs the reset signal upon detection by the input comparison circuit of the detection voltage Vc not exceeding the reference voltage Vref. The output circuit outputs the reset release signal upon detection by the input comparison circuit of the detection voltage Vc exceeding the reference voltage Vref. Namely, the comparator C2 compares the detection voltage Vc with the reference voltage Vref to output the voltage signal POR indicative of either the reset signal or the reset release signal in response to the result of the comparison. The outputting of the reset signal and the outputting of the reset release signal are mutually exclusive to each other. The outputting of the reset release signal is the same as releasing the reset state (i.e., negating the reset signal).

The reference voltage Vref has a constant voltage value that is generated by a step-down circuit (not shown) for converting the power supply voltage VDD into a lower voltage. The reference voltage Vref is applied to a non-inverted input terminal of the comparator C2. The detection voltage Vc is applied to an inverted input terminal of the comparator C2. The comparator C2 outputs a high-level voltage signal POR as the reset signal when the detection voltage Vc falls below the reference voltage Vref. The comparator C2 outputs a low-level voltage signal POR as the reset release signal when the detection voltage Vc exceeds the reference voltage Vref. The comparator C2 uses the power supply voltage VDD as its drive voltage.

The standby switches M1 and M2 serve as a blocking circuit to suppress electric currents flowing through a monitor circuit that monitors the power supply voltage VDD. The first voltage detecting circuit D1 serves as a first monitor circuit for monitoring the power supply voltage VDD. The first monitor circuit includes the resistor-based potential divider circuit R3 and R4 and the input comparison circuit of the comparator C2. The switch M1 serves as a first blocking circuit to block a current flowing through the resistor-based potential divider circuit R3 and R4. The switch M2 serves as a second blocking circuit to block a current flowing through the input comparison circuit of the comparator C2.

The switch M1 is a first switch that controls whether to apply the monitored voltage to the resistor-based potential divider circuit R3 and R4. The switch M2 is a second switch that controls whether to supply a current to the comparator C2. The switch M1 is connected in series to the resistor-based potential divider circuit R3 and R4. The switch M2 is connected in series to the power supply path of the comparator C2. The switches M1 and M2 are N-channel MOSFETs (hereinafter referred to as "NMOS"). The switches M1 and M2 are turned on upon receiving high-level input signals. The switches M1 and M2 are turned off upon receiving low-level input signals.

The turning on of the switch M1 causes the monitored voltage to be applied to the resistor-based potential divider circuit R3 and R4, and causes a current to flow through the resistor-based potential divider circuit R3 and R4. In response, the resistor-based potential divider circuit R3 and R4 performs the function to monitor the monitored voltage. Upon the turning off of the switch M1, the monitored voltage is not applied to the resistor-based potential divider circuit R3 and R4, and a current does not flow through the resistor-based potential divider circuit R3 and R4. In this state, the function of the resistor-based potential divider circuit R3 and R4 to monitor the monitored voltage is suppressed. The monitoring operation of the resistor-based potential divider circuit R3 and R4 thus comes to a halt.

The turning on of the switch M2 causes the power supply voltage VDD to be applied to the comparator C2, and causes a current to flow through the comparator C2. In this state, the input voltage monitor function of the comparator C2 is active. The turning on of the switch M2 causes the current path of the comparator C2 to be blocked, resulting in no current flowing through the comparator C2. In this state, the input voltage monitor function of the comparator C2 is suppressed. The monitoring operation of the input comparison circuit of the comparator C2 thus comes to a halt.

Figure 6:
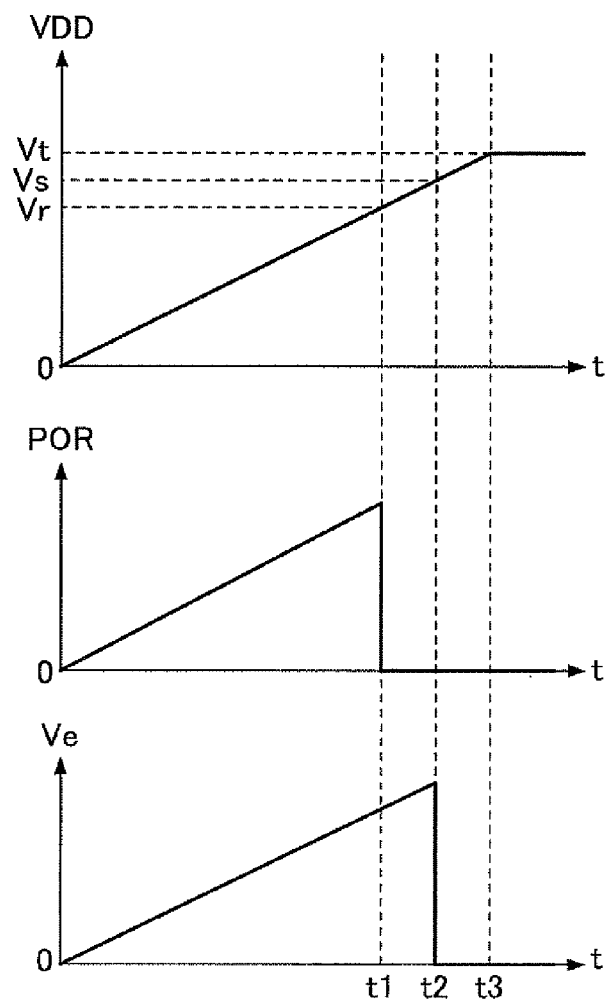
FIG. 6 is a drawing illustrating the behavior of the voltage signals POR and Ve in response to the temporal changes of the power supply voltage VDD.

The switches M1 and M2 turn on or off (i.e., become conductive or nonconductive) in response to the voltage level of the voltage signal Ve output from the second voltage detecting circuit D2. The second voltage detecting circuit D2 serves as a second monitor circuit that monitors the power supply voltage VDD, which is also monitored by the first monitor circuit. The second voltage detecting circuit D2 is capable of detecting whether the power supply voltage VDD exceeds a predetermined voltage value Vs, which is higher than a voltage value Vr that is observed as the voltage value of the power supply voltage VDD when the detection voltage Vc is equal to the reference voltage Vref (see FIG. 6). The voltage value Vs is lower than a target voltage Vt of the power supply voltage VDD as illustrated in FIG. 6. The target voltage Vt has a constant voltage value that is determined by a voltage control circuit such as a regulator (not shown).

Figure 4:
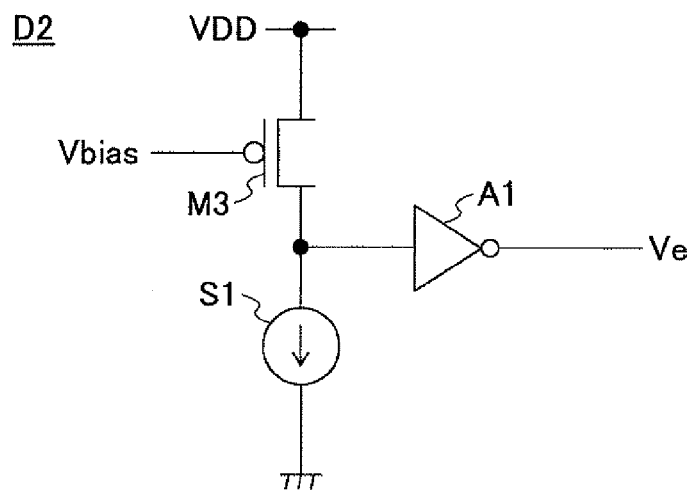
FIG. 4 is a circuit diagram illustrating an example of a second voltage detecting circuit.

FIG. 4 is a circuit diagram illustrating an example of the second voltage detecting circuit D2. The second voltage detecting circuit D2 includes a series circuit comprised of a current source S1 and a transistor M3, and also includes an inverter A1 having an input node thereof connected to a connection point between the current source S1 and the transistor M3. The transistor M3 is a P-channel MOSFET (hereinafter referred to as "PMOS"). The inverter A1 outputs a signal that is an inverse of the voltage level appearing at the connection point between the current source S1 and the transistor M3. The voltage signal Ve corresponds to the output signal of the inverter A1.

The transistor M3 is turned on when a voltage difference Vgs(=|Vbias−VDD|) between the bias voltage Vbias applied to the gate node of the transistor M3 and the power supply voltage VDD applied to the source node of the transistor M3 becomes larger than a threshold voltage Vth of the transistor M3. The voltage signal Ve output from the inverter A1 changes from a high level to a low level upon the turning on of the transistor M3.

Figure 5:
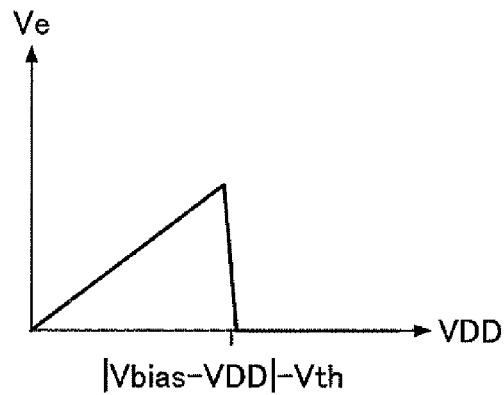
FIG. 5 is a drawing illustrating changes in a voltage signal Ve in response to a change in the power supply voltage VDD.

FIG. 5 is a drawing illustrating changes in the voltage signal Ve in response to a change in the power supply voltage VDD. Immediately after the start of applying the power supply voltage VDD, the voltage signal Ve increases in proportion to an increase in the power supply voltage VDD. During this period of a proportional increase, the voltage signal Ve is substantially equal to the power supply voltage VDD. The power supply voltage VDD then comes close to the voltage value Vs (at which |Vbias−VDD|−Vth=0). In response, the voltage signal Ve changes from the high level to the low level. Namely, the voltage signal Ve is at the low level when the power supply voltage VDD falls within the voltage range that satisfies the following relationship.

$$|Vbias-VDD|-Vth>0 \qquad (1)$$

The threshold voltage Vth of the transistor M3 is determined by the manufacturing process. Proper adjustment of the bias voltage Vbias provides that the voltage signal Ve makes a transition at a desired voltage value Vs. The voltage difference Vgs between Vbias and VDD increases as Vbias decreases, for example. In this case, the level shift of the voltage signal Ve occurs at a relatively low voltage value of the power supply voltage VDD. Conversely, the voltage different Vgs decreases as Vbias increases. In this case, the voltage value of the power supply voltage VDD, at which the level transition of the voltage signal Ve occurs, increases.

FIG. 6 is a drawing illustrating the behavior of the voltage signals POR and Ve in response to the temporal changes of the power supply voltage VDD. As the power supply voltage VDD rises from zero and then exceeds the voltage value Vr, the detection voltage Vc exceeds the reference voltage Vref. As a result, the level of the voltage signal POR output from the comparator C2 changes from a high level to a low level at timing t1. After the level shift of the voltage signal POR occurs, the power supply voltage VDD exceeds the voltage value Vs. In response, the level of the voltage signal Ve output from the second voltage detecting circuit D2 changes from a high level to a low level at timing t2. After this, the power supply voltage VDD stably stays at the target voltage Vt after timing t3.

The change of the voltage signal Ve to the low level causes the switches M1 and M2 to be turned off. The turned-off switches M1 and M2 block currents that would flow through the resistor-based potential divider circuit R3 and R4 and the comparator C2. This current blockage suspends the operation of the resistor-based potential divider circuit R3 and R4 and the comparator C2.

As described above, the currents that would flow through the resistor-based potential divider circuit R3 and R4 and the comparator C2 are stopped after the timing t2. Accordingly, current consumption is effectively reduced in the period following timing t3, which accounts for the majority of the operating period from the start to the end of applying the power supply voltage VDD.

Figure 7:
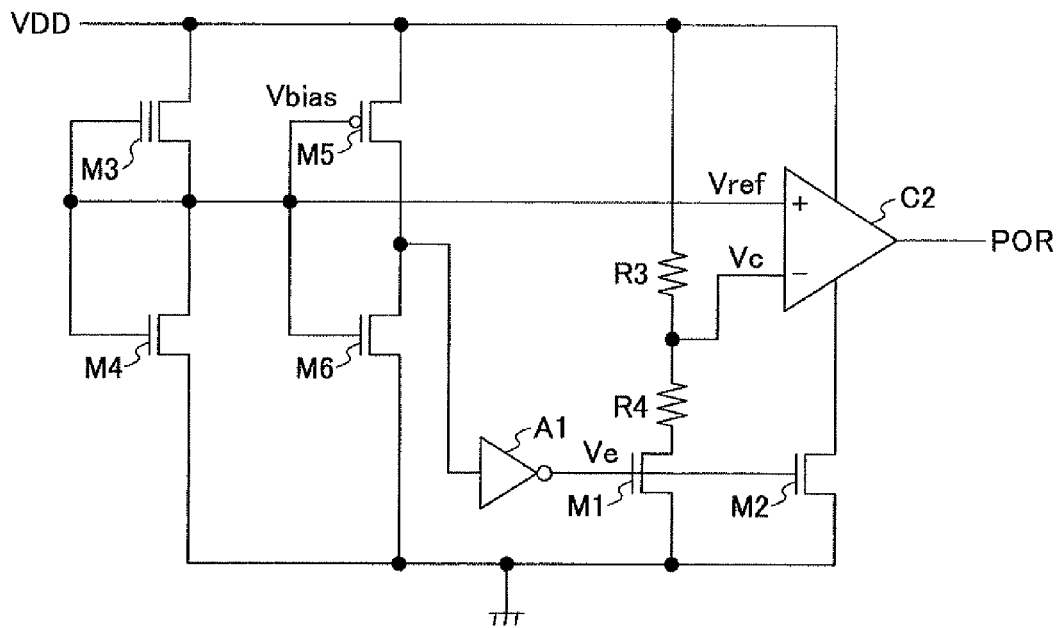
FIG. 7 is a drawing illustrating a specific example of the second voltage detecting circuit and a circuit for generating the reference voltage Vref provided in the power-on reset circuit.

FIG. 7 is a drawing illustrating a specific example of the second voltage detecting circuit D2 and a circuit for generating the reference voltage Vref provided in the power-on reset circuit 1 illustrated in FIG. 3.

The circuit for generating the reference voltage Vref (hereinafter referred to as "Vref generating circuit") includes a depletion-type MOSFET (NDMOS) transistor M3 having the drain thereof connected to the power supply voltage VDD and a transistor M4 having a diode connection. The gate and source of the transistor M3 are connected to each other to provide a gate-source voltage of 0 V, thereby causing a constant drain current to flow through the transistor M3. The Vref generating circuit thus generates a constant reference voltage Vref lower than the power supply voltage VDD based on the power supply voltage VDD.

The second voltage detecting circuit D2 includes a PMOS transistor M5 having the source thereof connected to the power supply voltage VDD, an NMOS transistor M6 having the source thereof connected to the ground, and an inverter A1. The second voltage detecting circuit D2 has a circuit configuration in which the reference voltage Vref is applied as the bias voltage Vbias to the transistor M5 and the transistor M6. A voltage signal appearing at the connection point between the drain of the transistor M5 and the drain of the transistor M6 is applied to the inverter A1. The output signal Ve of the inverter A1 is applied to the switch M1 connected to the ground-side end of the resistor-based potential divider circuit R3 and R4, and is also applied to the switch M2 connected to the ground side of the comparator C2.

Figure 9:
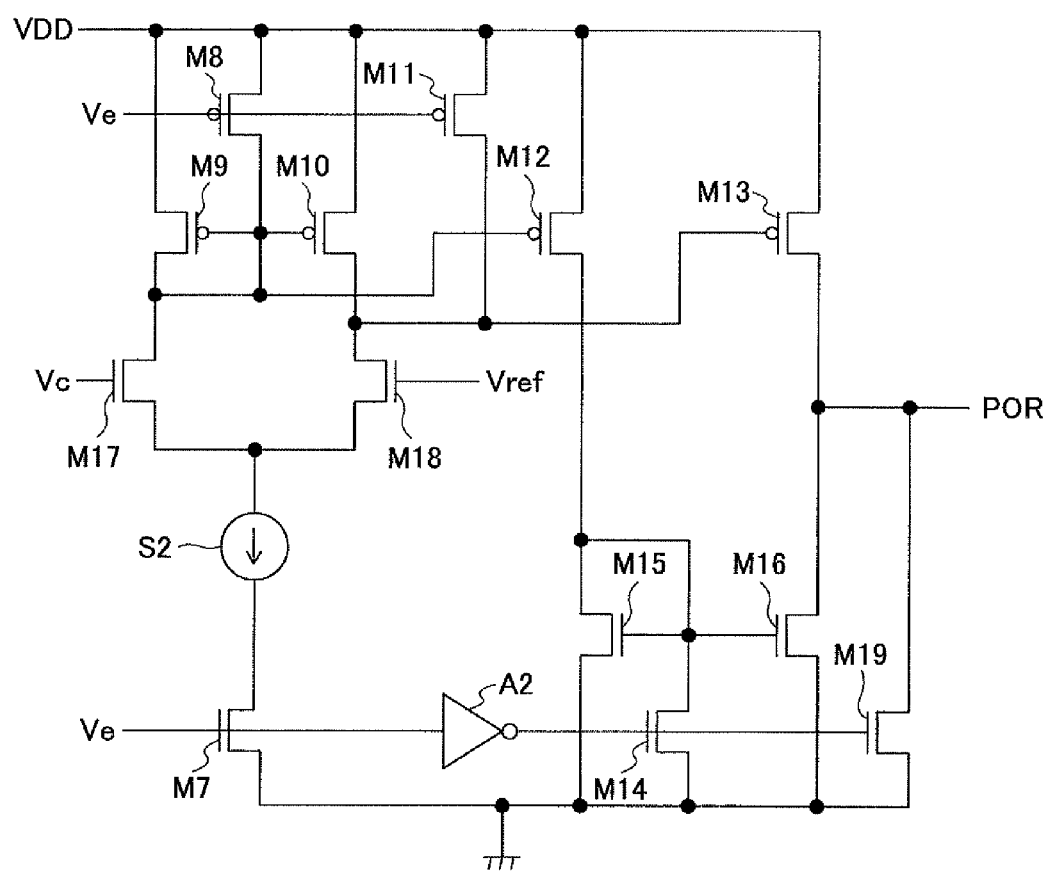
FIG. 9 is a drawing illustrating the circuit configuration of a comparator.

FIG. 9 is a drawing illustrating the circuit configuration of the comparator C2. The comparator C2 includes transistors M9, M10, M17, and M18 and a current source S2, which together serve as an input comparison circuit that compares the detected voltage with the predetermined reference voltage Vref. The comparator C2 further includes transistors M12, M13, M15, and M16, which together serve as an output circuit that outputs the voltage signal POR, which serves either as the reset signal or as the reset release signal. The transistors M15, M16, M17, and M18 are NMOS transistors, and transistors M9, M10, M12, and M13 are PMOS transistors. An NMOS switch M7 corresponds to the switch M2 previously described.

The comparator C2 further includes an inverter A2, switches M14 and M19, and switches M8 and M11, which together serve as a compensation circuit that compensates for the reset release signal when the switch M7 is in a turned-off state in response to the inputting of the low-level voltage signal Ve. This compensation circuit functions as an output fixing circuit that fixes the output signal of the comparator C2 to a predetermined potential. The predetermined potential is equal to the potential indicative of reset release.

In the following, the operation of the circuit illustrated in FIG. 9 will be described. When the voltage signal Ve is at the high level, the switch M7 is in the ON state, and the switches M14 and M19 are in the OFF state. Because of the ON state of the switch M7, the input comparison circuit operates to provide its function. Namely, the switch M13 is turned on in response to the detection voltage Vc being lower than the reference voltage Vref, so that the voltage signal POR is set to the high level (indicating a reset state). Also, the switches M12 and M16 are turned on in response to the detection voltage Vc being higher than the reference voltage Vref, so that the voltage signal POR is set to the low level (indicating a reset release state).

After this, the voltage signal Ve changes from the high level to the low level. The low-level voltage signal Ve turns off the switch M7. The switches M14 and M19 are turned on upon receiving a high-level voltage signal that is an inverse of the low-level voltage signal Ve generated by the inverter A2. The nonconductive state of the switch M7 blocks a current flowing through the input comparison circuit, thereby causing the monitoring operation thereof to come to a halt.

In this case, the PMOS switches M8 and M11 of the compensation circuit are turned on in response to the inputting of the low-level voltage signal Ve. As a result, the drain nodes of the transistors M17 and M18 of the input comparison circuit are pulled up to the power supply voltage VDD. In response, the switches M12 and M13 of the output circuit are turned off. Since the NMOS switch M14 of the compensation circuit is in the conductive state, the drain node of the switch M14 is pulled down to the ground. Since the NMOS switch M19 is also in the conductive state, the output voltage signal POR is set to the ground level.

Namely, the gate nodes of the PMOS transistors M12 and M13 of the output circuit are set to HIGH, the gate node of the transistor M16 is set to LOW, and the gate node of the switch M19 is set to HIGH, resulting in the voltage signal POR being set equal to the low level.

In this manner, the voltage signal POR stays at the low level without any change upon the turning off of the switches M1 and M7 (i.e., M2). This prevents peripheral circuits from being accidentally reset.

Figure 8:
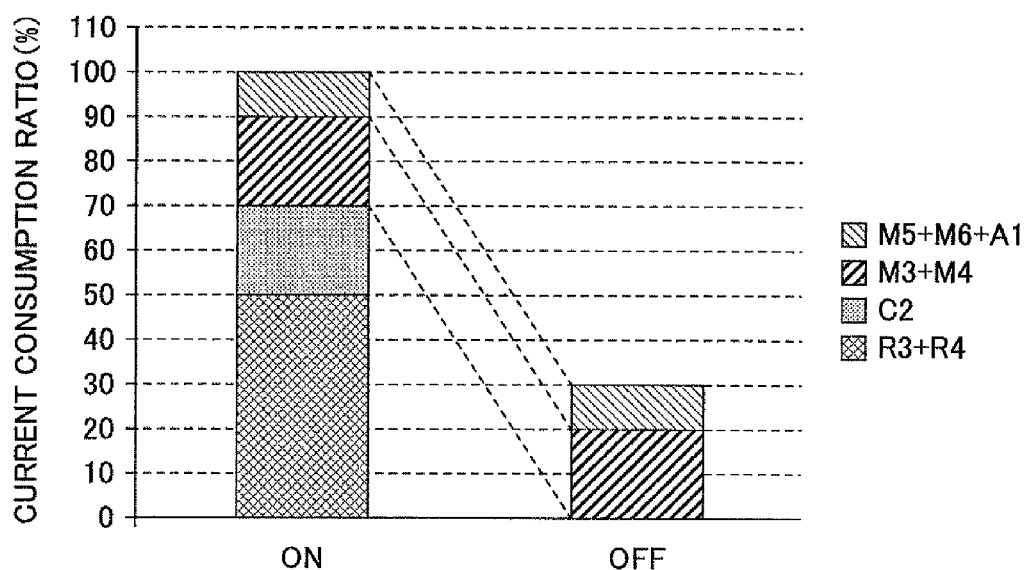
FIG. 8 is a drawing illustrating current consumption by the circuit of FIG. 7 as observed in a condition in which the switches M1 and M2 are turned on and as observed in another condition in which the switches M1 and M2 are turned off.

FIG. 8 is a drawing illustrating current consumption by the power-on reset circuit 1 having the circuit configurations illustrated in FIG. 7 and FIG. 9 as observed in two different conditions, i.e., a condition in which the switches M1 and M2 are turned on and the other condition in which the switches M1 and M2 are turned off. As illustrated in FIG. 8, the turned-off switches M1 and M2 block currents that would flow through the resistor-based potential divider circuit R3 and R4 and the input comparison circuit of the comparator C2. Consequently, current consumption is reduced.

Figure 1:
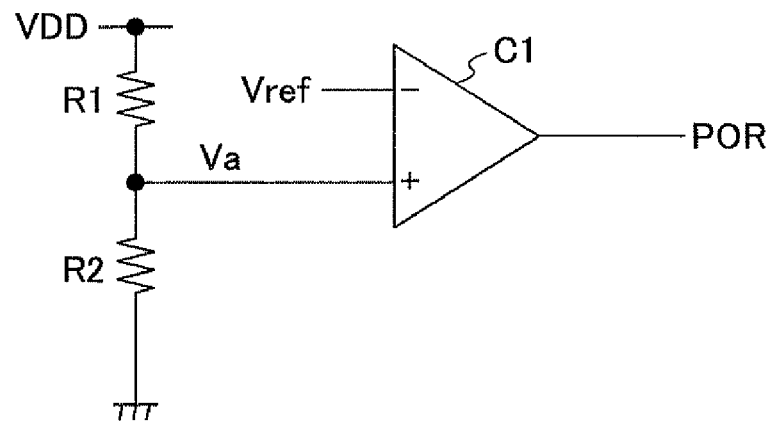
FIG. 1 is a drawing illustrating a basic configuration of a related-art power-on reset circuit.
Figure 2:
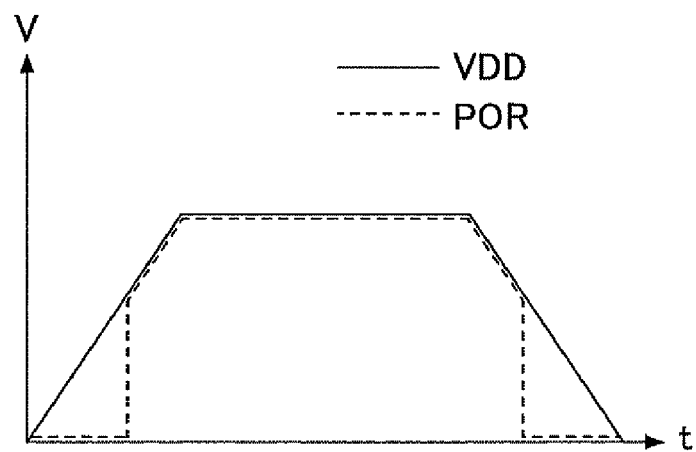
FIG. 2 is a time chart illustrating the changes of a voltage signal POR and a power supply voltage VDD from the start to the end of applying a power supply voltage VDD in the circuit of FIG. 1.

In comparison with the related-art power-on reset circuit of FIG. 1, the power-on reset circuit 1 of the present embodiment has an additional control circuit. Such an additional control circuit includes the second voltage detecting circuit D2 (M5+M6+A1), a suppression circuit (M1+M2) for suppressing currents flowing through the first monitor circuit (R3+R4+input comparison circuit of C2), and a compensation circuit (A2+M8+M11+M14) for compensating for the reset release signal. The power-on reset circuit 1 of the present embodiment employs the above-noted newly added control circuit to block the currents that would flow through the first monitor circuit (R3+R4+input comparison circuit of C2). With this provision, reduction in current consumption is supposed to be achieved when compared with the related-art power-on reset circuit (FIG. 1). To this end, provision is made such that the current consumption by the additional circuit is smaller than the reduction in current consumption achieved by the current blocking. Further, the period during which the switches M1 and M2 are in the turned-off state is sufficiently longer than the period during which these switches are in the turned-on state. The period during which the switches M1 and M2 are turned off accounts for most of the period during which the power supply voltage VDD is applied. Accordingly, provision is made such that the current consumed by the additional control circuit when the switches M1 and M2 are in the nonconductive state is smaller than the current consumed by the first monitor circuit (R3+R4+input comparison circuit of C2) when the switches M1 and M2 are in the conductive state.

Currents consumed by the suppression circuit (M1+M2) and the compensation circuit (A2+M8+M11+M14) are almost zero when the switches M1 and M2 are in the turned-off state. Further, as illustrated in FIG. 8, the current consumed by the second voltage detecting circuit D2 (M5+M6+A1) when the switches M1 and M2 are in the nonconductive state is smaller than the current consumed by the first monitor circuit (R3+R4+input comparison circuit of C2) when the switches M1 and M2 are in the conductive state. Accordingly, the current consumed by the additional control circuit when the switches M1 and M2 are in the nonconductive state is smaller than the current consumed by the first monitor circuit (R3+R4+input comparison circuit of C2) when the switches M1 and M2 are in the conductive state. In this manner, the addition of the new control circuit can still reduce current consumption when compared with the related-art circuit as illustrated in FIG. 1.

As described heretofore, the present embodiment can reduce current consumption without undermining the function of the power-on reset circuit, i.e., without producing an erroneous reset signal. Further, an erroneous reset release signal is absent not only at the start of applying the power supply voltage VDD but also at the end of applying the power supply voltage VDD. Since the switches M1 and M2 are changed from the nonconductive state to the conductive state at a voltage value of the power supply voltage VDD that is higher than the voltage value causing a switch from the reset release mode to the reset mode, the signal level of the voltage signal POR is not erroneously inverted.

Further, the present invention is not limited to these embodiments, but various variations and modifications may be made without departing from the scope of the present invention.

Figure 10:
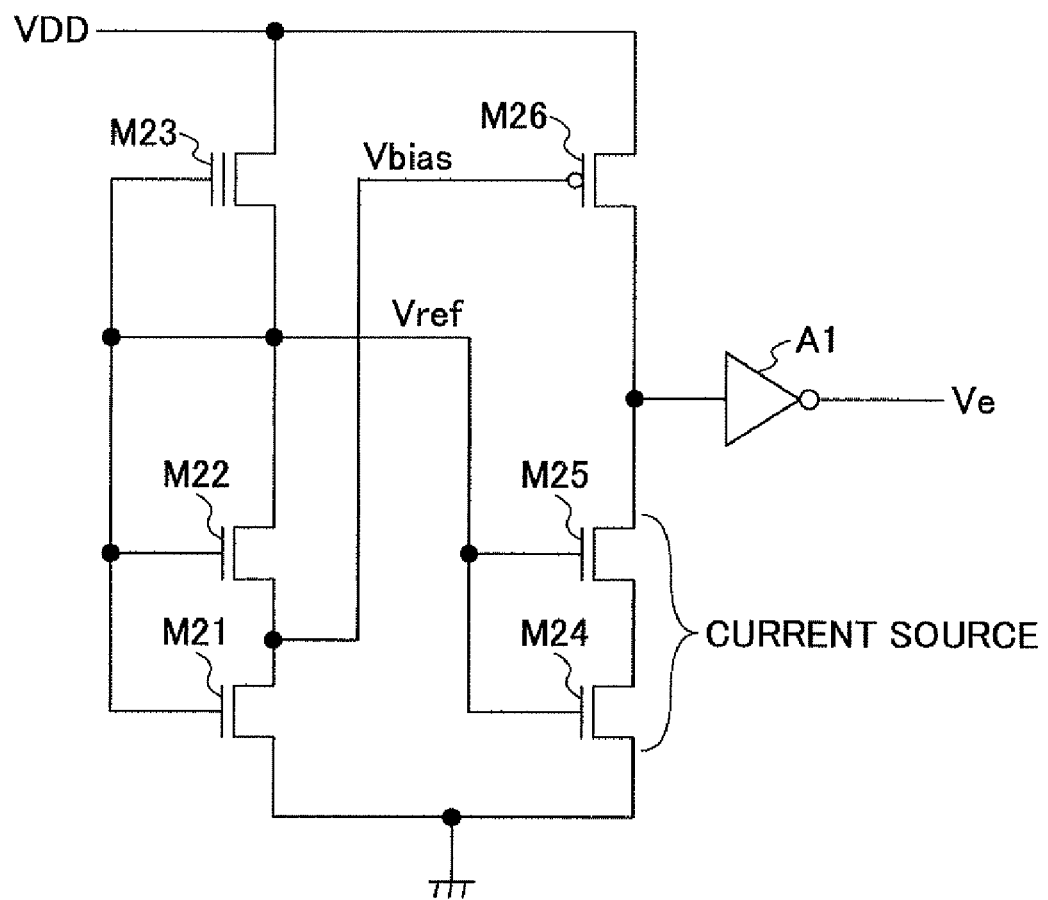
FIG. 10 is a drawing illustrating a variation of the second voltage detecting circuit.

FIG. 10 is a drawing illustrating a variation of the second voltage detecting circuit D2. The second voltage detecting circuit D2 illustrated in FIG. 10 can invert the voltage signal Ve to cut consumed current in the lower voltage range of the power supply voltage VDD than can the second voltage detecting circuit D2 of FIG. 7.

The bias voltage Vbias applied to a PMOS transistor M26 is supplied from the source node of an NMOS transistor M22 configured in a diode connection. With this provision, the bias voltage Vbias is set lower by a margin equal to the threshold voltage of the transistor M22 than the bias voltage Vbias of FIG. 7. As a result, a voltage value of the power supply voltage VDD that causes the PMOS transistor M26 to be turned on is set lower than in the case of the configuration illustrated in FIG. 7.

The detection circuit (M5, M6) illustrated in FIG. 7 has an inverter configuration in which two transistors are arranged in series. In order to invert the voltage signal Ve by changing the output level of the detection circuit (M5, M6), VDD/2>Vref (i.e., VDD>2×Vref) needs to be satisfied. When Vref is 1 V, for example, the power supply voltage VDD needs to exceed 2 V in order to invert the voltage signal Ve.

In the case of FIG. 10, on the other hand, the bias voltage Vbias is equal to Vref−Vth1 where Vth1 is the threshold voltage of the transistor M22. With the threshold voltage of the transistor M26 being denoted as Vth2, the PMOS transistor M26 is turned on if VDD>Vth2+Vbias is satisfied. With Vref=1 V, Vth1=0.8 V, and Vth2=0.8 V, for example, the power supply voltage VDD exceeding 1 V suffices to invert the voltage signal Ve. In reality, however, an overdrive voltage (Vgs−Vth2) in the range of 0.1 to 0.2 V is required for the PMOS transistor M26 at the time of inverting the voltage signal Ve. The voltage signal Ve is thus inverted when the power supply voltage VDD is around 1.1 V to 1.2 V.

Further, the voltage signal POR at the low level may serve as the reset signal, and the voltage signal POR at the high level may serve as the reset release signal, for example. In this case, an inverter may be provided at the output of the comparator C2 in the case of the circuit illustrated in FIG. 3. Alternatively, the detection voltage Vc may be applied to a non-inverted input terminal of the comparator C2, and the reference voltage Vref may be applied to an inverted input terminal of the comparator C2.

The present application is based on Japanese priority application No. 2010-104330 filed on Apr. 28, 2010, with the Japanese Patent Office, the entire contents of which are hereby incorporated by reference.

What is claimed is:

1. A power-on reset circuit, comprising:

a first monitor circuit that monitors a power supply voltage;

an output circuit that outputs a reset release signal upon detection, by the first monitor circuit, of the power supply voltage exceeding a first predetermined value; and a control circuit having lower current consumption than the first monitor circuit, wherein the control circuit includes:

a second monitor circuit that monitors the power supply voltage;

a suppression circuit that suppresses current flowing through the first monitor circuit upon detection, by the second monitor circuit, of the power supply voltage exceeding a second predetermined value higher than the first predetermined value; and an output fixing circuit that fixes the output of the output circuit to a predetermined potential upon detection, by the second monitor circuit, of the power supply voltage exceeding the second predetermined value.

2. The power-on reset circuit as claimed in claim 1, wherein the first monitor circuit includes a resistor-based potential divider circuit that divides the power supply voltage by resistors to produce a detection voltage responsive to the power supply voltage, and the suppression circuit suppresses a current flowing through the resistor-based potential divider circuit.

3. The power-on reset circuit as claimed in claim 2, wherein the first monitor circuit includes an input comparison circuit that compares the detection voltage of the power supply voltage with the first predetermined value, and the suppression circuit suppresses a current flowing through the input comparison circuit.

* * * * *